(12) United States Patent
Wong et al.

(10) Patent No.: US 6,572,001 B2
(45) Date of Patent: Jun. 3, 2003

(54) BONDING SYSTEM

(75) Inventors: Yam Mo Wong, Singapore (SG); Keng Yew Song, Singapore (SG)

(73) Assignee: ASM Technology Singapore PTE Ltd., Singapore (SG)

( * ) Notice: Subject to any disclaimer, the term of this patent is extended or adjusted under 35 U.S.C. 154(b) by 0 days.

(21) Appl. No.: 09/899,485

(22) Filed: Jul. 5, 2001

(65) Prior Publication Data

US 2003/0006266 A1 Jan. 9, 2003

(51) Int. Cl.$^7$ ................................. B23K 37/00
(52) U.S. Cl. ........................... 228/4.5; 700/95
(58) Field of Search .................. 228/102, 1.1, 4.5, 228/10, 6.2, 103; 700/95

(56) References Cited

U.S. PATENT DOCUMENTS 5,207,370 A * 5/1993 Mochida et al.
5,608,638 A * 3/1997 Tain et al.
6,297,472 B1 * 10/2001 Bong et al.

* cited by examiner

*Primary Examiner*—Tom Dunn
*Assistant Examiner*—Jonathan Johnson
(74) *Attorney, Agent, or Firm*—Ostrolenk, Faber, Gerb & Soffen, LLP

(57) ABSTRACT

A bonding system (1) bonds wires between a first electrical contact surface on a semiconductor chip and a second electrical contact surface on a substrate. The bonding system (1) has a first memory device (3) having a master bond program stored thereon and a second memory device (4) having an operating bond program stored thereon.

10 Claims, 2 Drawing Sheets

BONDING SYSTEM

FIELD OF THE INVENTION

The invention relates to a bonding system, and in particular, a bonding system for bonding wires between a semiconductor chip and a substrate on which the semiconductor chip is mounted.

DESCRIPTION OF THE PRIOR ART

During the packaging of semiconductor devices, it is common to mount a semiconductor chip (or die) on a substrate, such as a lead frame or a printed circuit board. A wire bonder is then used to form wire bonds between electrical input/output contact pads (or bond pads) on the die and electrical contact surfaces on the substrate. The wire bonder operates under control of a bonding program stored on the wire bonder that includes a set of bonding parameters, which are generally specific to each die/substrate combination. For example, the bonding parameters can include bond coordinates, bonding force, bonding time, ultrasonic power and electric flame off control for free air ball formation.

Due to variations between individual wire bonders and/or individual dies and substrates, it is usually necessary for an operator to modify the bonding parameters used on a specific wire bonder to ensure that satisfactory bonds are formed between the correct corresponding bond pads and contact surfaces on the substrate.

However, this also creates problems as an operator may inadvertently modify the bonding parameters so that erroneous bonds are performed by the wire bonder.

SUMMARY OF THE INVENTION

In accordance with a first aspect of the present invention, there is provided a bonding system for bonding wires between a first electrical contact surface on a semiconductor chip and a second electrical contact surface on a substrate, the bonding system comprising a first memory device having a master bond program stored thereon, a second memory device having an operating bond program stored thereon, the operating bond program being generated by transferring a copy of the master bond program from the first memory device to the second memory device, the second memory device being adapted to permit a parameter of the operating bond program to be modified; a processing device coupled to the first and second memory devices; an input device coupled to the processing device; and an output device coupled to the processing device; the processing device, on receiving an input signal from the input device to modify a parameter of the operating bond program, comparing the modified parameter with the corresponding parameter in the master bond program and storing the modified parameter in the operating bond program if the modified parameter is within a tolerance of the corresponding parameter in the master bond program, and the processing device outputting a signal to the output device if the modified parameter is not within the tolerance.

An advantage of the invention is that it enables an operator to modify bond parameters while verifying the modified parameters with the master bond program to minimise the risk of an operator inadvertently modifying a parameter so that the wire bonder performs an incorrect or unreliable bond.

Preferably, the parameters which may be modified comprise bonding coordinates for the first and/or second contact surface.

Typically, the bond parameters of the operating program which may be modified comprise bond process parameters, such as bonding force, ultrasonic bonding power, bonding times and electric flame off control for free air ball formation.

Preferably, if the modified perimeter is not within the tolerance of the corresponding parameter in the master bond program, the processor controls the wire bonder to stop wire bonding operations.

Typically, the tolerance for the bond parameter is predetermined and is preferably, stored in the master bond program.

BRIEF DESCRIPTION OF THE DRAWINGS

An example of a bonding system in accordance with the invention will now be described with reference to the accompanying drawings in which.

DESCRIPTION OF PREFERRED EMBODIMENTS

Figure 1:
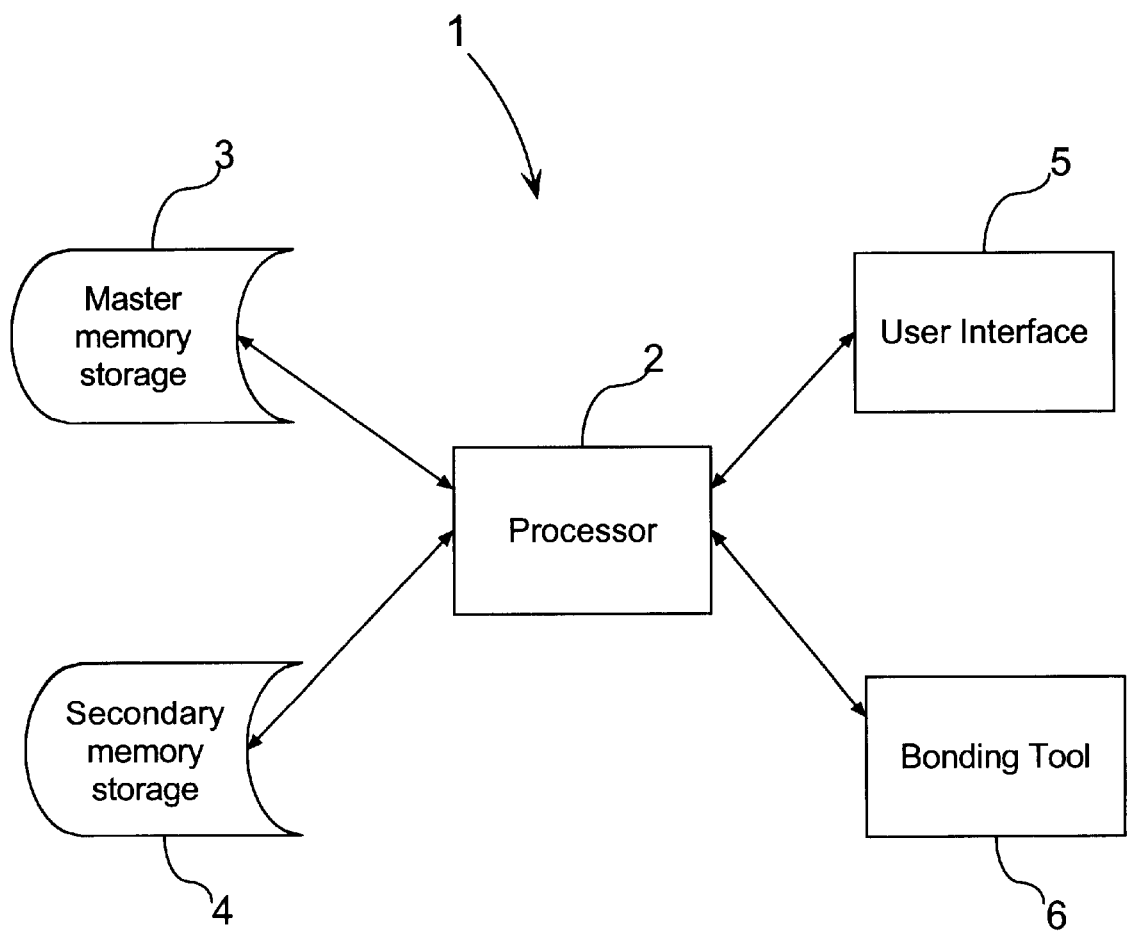
FIG. 1 is a schematic block diagram of a bonding system.

FIG. 1 shows a bonding system 1. The bonding system 1 includes a bonding tool 6 and a user interface 5 coupled to a processor 2. The user interface 5 includes an input device (not shown), which enables a user to enter data and command instructions to the processor 2, and a display device (not shown), which enables the processor to output information to the user. The bonding tool 6 is controlled by the processor 2. The bonding system 1 also includes a master memory device 3 and secondary memory device 4. Both the master and the second memory devices 3, 4 are coupled to the processor 2 and are typically, random access memory devices (RAM). In use, a master bond program is stored in the memory 3 and an operating bond program is stored in the memory 4. The processor 2 uses the operating bond program to control the bonding tool 6.

Both the master bond program and the operating bond program include process control instructions, including bond parameters, to enable the processor 2 to control the bonding tool 6. The bond parameters include the coordinates of each of the bonds on bond pads on a semiconductor chip and each of the bonds on the bond surfaces on a substrate, such as a lead frame or a printed circuit board (PCB). The parameters also include bond process parameters, such as bonding force, ultrasonic power for the bonds, bonding time and electric flame-off control for free air ball formation prior to bonding to a bond pad on a die.

For each different die/substrate combination, a different master bond program is required, as the coordinates of the bonds will vary depending on the die/substrate combination and the process parameters will vary depending on the material of the contact surfaces to which the wires are to be bonded and the wire used for bonding. Accordingly, the master bond program stored in the master memory device 3 will depend on the die/substrate combination being bonded by the bonding system 1. In addition, the master bond program includes pre-defined tolerances for each of the bond parameters and the bond process parameters.

Figure 2:
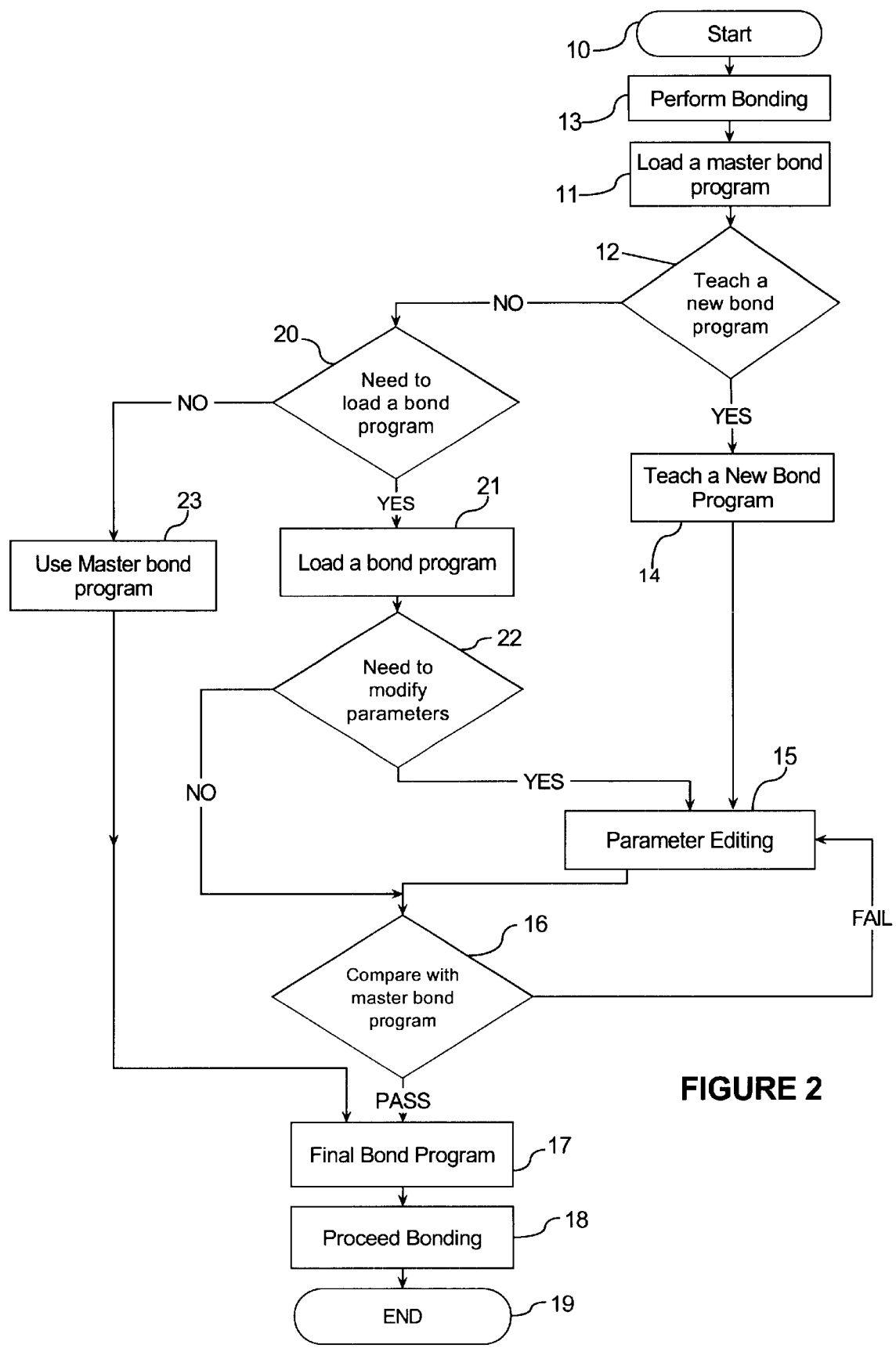
FIG. 2 is a flow diagram showing operation of the bonding system.

FIG. 2 is a flow diagram showing operation of the bonding system 1. After the bonding system is started 10, an operator instructs the bonding system 1 via the user interface 5 that a bonding operation is to be performed 13. The operator loads 11 a master bond program into the master memory device 3. The master bond program loaded into the master memory device 3 is the master bond program corresponding to the die/substrate combination on which wire bonds are to made by the bonding tool 6.

The processor 2 then queries the operator, using the display device of the user interface 5, whether the operator wishes to teach the bonding system a new operating bond program 12. If the operator selects "YES", using the input device of the user interface 5, the processor enters a teach new operating bond program routine 14. Initially, the processor makes a copy of the master bond program 2 and stores the copy in the secondary memory 4. The processor 2 then enables the operator to edit 15 the bond and process parameters to suit the particular bonding system 1 being used.

As each wire bonder is different, it is usually necessary for an operator to modify the bond and/or process parameters so to ensure the wire bonder correctly performs the bonds on the bond pads of the die and the bond surfaces on the substrate. This may be necessary for example to take into account differences in the translational and rotational position of the die/substrate combination when loaded into the wire bonder.

After parameter editing 15 is finished, the processor compares 16 all the bond and process parameters with the pre-defined tolerances in the master bond program. If all the parameters are within the tolerances set in the master bond program, the modified master bond program stored in the secondary memory device 4 is approved by the processor and becomes the final operating bond program 17. The processor 2 then proceeds with the bonding operation 18 using the operating bond program to control the bonding tool 6. After wire bonding is completed the process ends 19.

If any of the parameters are not within the tolerances set in the master bond program the comparison 16 fails and the operator is returned to parameter editing 15 to enable the operator to correct the parameters that are outside the tolerances in the master bond program. Typically, when the operator is returned to parameter editing 15, the processor will display an error message on the user interface with information of the parameters that are outside the pre-defined tolerances in the master bond program.

If in step 12, the operator decides not to teach a new operating bond program, the operator is queried 20 whether he wishes to load a pre-taught operating bond program. If the operator responds with "YES", the processor enables the operator to load 21 a pre-taught operating bond program into the secondary memory device 4. The processor then queries whether any of the pre-taught operating program parameters are to be modified 22. If the operator responds that the parameters do need to be modified, the parameter editing 15 is entered, and the operator is permitted to modify the bond and process parameters of the pre-taught operating bond program. If the modified pre-taught operating program passes the comparison test 16 with the master bond program, the modified pre-taught bond program becomes the final operating bond program 17 and the wire bonding operation proceeds. If the comparison 16 fails, the operator is returned to the parameter editing 15 to modify the parameters until the modified pre-taught operating bond program passes the comparison 16.

If the operator chooses not to modify the parameters of the pre-taught bond program at step 22, the unmodified pre-taught bond program is compared 16 with the master bond program stored in the master memory device 3. If the comparison 16 is passed, the unmodified pre-taught bond program becomes the final operating bond program 17 and the wire bonding operation proceeds 18. If the comparison 16 fails, the operator is passed to the parameter editing 15 to modify the parameters until the comparison 16 is passed.

If in step 20, the operator chooses not to load a pre-taught operating bond program, the master bond program in the master memory device 3 is copied by the processor 2 into the secondary memory device 4. The copied master bond program in the secondary memory device 4 then becomes the final operating bond program 17 and the wire bonding operation proceeds 18. The invention has the advantage of providing real time comparison of the modified parameters with the master set of parameters to help minimise the possibility of an operator incorrectly modifying the parameters and thereby reduces the problems of incorrect bonding on a die and/or substrate.

We claim:

1. A bonding system for bonding wires between a first electrical contact surface on a semiconductor chip and a second electrical contact surface on a substrate, the bonding system comprising:
   a data processing device;
   a user-operable input device coupled to the data processing defice that generates operating commands for the system;
   an output display device coupled to the data processing device;
   first and second memory devices coupled to the data processing device;
   the first memory device having a master bond program stored theron that defines parameter values for a series of bonding steps involving a semiconductor slip and the substrate;
   the data processing device being responsive to an operating command to generate and operating bond program by transferring a copy of the master bond program from the first memory device to the second memory device;
   the data processing device being responsive to a further operating command to:
   generate an modified value of a selected parameter of the operating bond program;
   compare the modified value with the original value of the selected parameter in the master bond program; and
   replace the original value of the selected parameter with the modified value in the operating bond program but not in the master bond program if the modified value is within a predetermined tolerance of variation for the selected parameter.

2. A bonding system according to claim 1, wherein the modified parameter is a bonding coordinate.

3. A bonding system according to claim 1, wherein the modified parameter is a bond process parameter.

4. A bonding system according to claim 3, wherein the bond process parameter is selected from the group consisting of bonding force, ultrasonic bonding power, bonding time and electric flame-off control for free air ball formation.

5. A bonding system according to claim 1, further including a wirebonder; and wherein the data processing device controls the wirebonder to stop a wire bonding operation if the modified value of the selected parameter is not within the predetermined tolerance of variation.

6. A bonding system according to claim 1, wherein the tolerance value for the bond parameter is part of the master bond program.

7. A bonding system according to claim 1, wherein the tolerance value is stored as part of the master bond program.

8. A bonding system according to claim 1, further including a wire bonding device operable by the data processing device and in accordance with the operating bond program in the second memory device.

9. A bonding system according to claim 1, wherein the bond process parameter is selected from the group consisting of bonding force, ultrasonic bonding power, bonding time and electric flame-off control for free air ball formation.

10. A bonding system according to claim 1, wherein the data processing device is responsive to the further operating command to provide an error signal to the output device if the modified value of the selected parameter is not within the predetermined tolerance of variation.

* * * * *